United States Patent [19]

Hernqvist

[11] 4,156,826

[45] May 29, 1979

[54] MERCURY ARC LAMPS

[75] Inventor: Karl G. Hernqvist, Princeton, N.J.

[73] Assignee: RCA Corporation, New York, N.Y.

[21] Appl. No.: 901,821

[22] Filed: May 1, 1978

[51] Int. Cl.² .............................................. H01J 61/30
[52] U.S. Cl. ..................................... 313/221; 313/227
[58] Field of Search ................................ 313/221, 227

[56] References Cited
PUBLICATIONS

"Fused Quartz Catalog," General Electric Company, Sections IIa and IIC3.

*Primary Examiner*—Rudolph V. Rolinec
*Assistant Examiner*—Darwin R. Hostetter
*Attorney, Agent, or Firm*—Eugene M. Whitacre; Glenn H. Bruestle; Vincent J. Coughlin, Jr.

[57] ABSTRACT

A mercury arc lamp envelope is made of high purity synthetic fused silica which contains total metallic impurities of less than one part per million by weight and OH radical content of less than five parts per million by weight. Lamps having envelopes made from this material show little or no devitrification after 1000 hours of operation.

1 Claim, 1 Drawing Figure

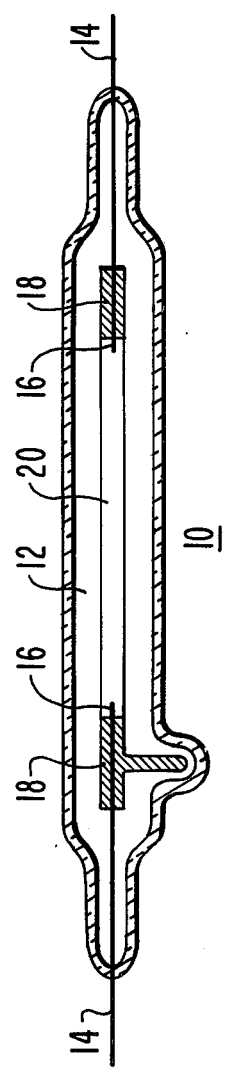

MERCURY ARC LAMPS

BACKGROUND OF THE INVENTION

This invention relates to high pressure discharge devices and particularly to an improved envelope for devices such as mercury arc lamps which have particular application in the manufacturing of television picture tubes and in integrated circuit fabrication.

Commercially available mercury arc lamps comprise a sealed fused quartz envelope forming a chamber and having lead-in conductors sealed in and extending a short distance through the ends of the envelope and terminating in electrodes of the same material as the lead-in conductors. The lamps further comprise pools of mercury contained within the envelope and positioned in the ends of the envelope surrounding the electrodes. Such lamps exhibit a limited useful life of about 100 hours because of devitrification of the fused quartz envelope. Devitrification means a change in the glasslike properties of the envelope material, particularly the transparency but it also includes and is not limited to changes in brittleness and hardness. Devitrification begins near the mercury pools at the ends of the envelope and spreads toward the center of the envelope during lamp operation. After about 100 hours of operation, devitrification has progressed to the extent that the luminous output of the lamp is reduced below a useful level and the lamp must be replaced.

Early workers in the lamp field believed that devitrification was caused by excessive arc temperature (see U.S. Pat. No. 2,321,178—Bourne et al.). Others believed that devitrification was caused by impurities forming centers of recrystallization which could be controlled by reducing the particle size of the impurities and homogeneously dispersing these impurities throughout the quartz material used to form the lamp envelope prior to resolidification (see U.S. Pat. No. 2,904,713 and U.S. Pat. No. 3,128,169—Heraeus et al.). Still others recognized that the presence of hydrogen shortened lamp life and constructed double walled bulbs including an outer bulb of hard glass encasing a quartz lamp therein. An inert gas atmosphere was included between the quartz lamp and the hard glass outer bulb to prevent diffusion of hydrogen from the ambient atmosphere through the hot wall of the quartz envelope (see U.S. Pat. No. 2,611,833—Noel). In another embodiment a glaze was applied to the exterior surface of the quartz in an attempt to reduce hydrogen diffusion and prevent devitrification (see U.S. Pat. No. 2,568,459). A publication by J. F. Waymouth entitled Electric Discharge Lamps, (p. 184, Cambridge, Mass., The MIT Press, 1971) and a report by C. Kenty, entitled The Liberation of Hydrogen and Carbon Monoxide In Glass by Ultraviolet Radiation, (p. 138, report delivered at the 1953 MIT Physical Electronics Conference and published in the conference proceedings) discussed the dissociation of OH radicals in glass and the diffusion of hydrogen through quartz. Despite the amount of information available concerning devitrification, this body of information is insufficient to permit the construction of mercury arc lamps that do not devitrify after a short period of operation. Devitrification continues to be a major cause of limited lamp life.

The terms fused quartz and fused silica as used in this disclosure mean if naturally occuring quartz crystal is melted to make glass, the material is called fused quartz but if a synthetic or a condensed silicon dioxide is melted, the material is synthetic fused silica.

The present inventor has discovered that devitrification cannot be eliminated by simply using fused quartz of high purity or synthetic fused silica of still higher purity. To eliminate devitrification it is necessary to establish and control both the total metallic impurity content and the OH radical content of the envelope material.

SUMMARY OF THE INVENTION

An improved mercury arc lamp comprises a high purity synthetic fused silica envelope having total metallic impurities of less than one part per million by weight and having an OH radical content of less than five parts per million by weight.

BRIEF DESCRIPTION OF THE DRAWING

The single FIGURE of the accompanying drawing is a cross-sectional view of a mercury arc lamp.

DETAILED DESCRIPTION OF THE PREFERRED EMBODIMENT

Referring to the accompanying drawing, an improved mercury arc lamp 10 comprises a synthetic fused silica envelope 12 having total metallic impurities of less than one part per million and OH-content of less than five parts per million. The envelope 12 includes a small internal bore of the order of a few millimeters. The envelope 12 is substantially cylindrical along its longitudinal axis and shaped at each end to form a chamber having lead-in conductors 14 sealed in and extending through the ends thereof terminating in electrodes 16 which are an extension of the lead-in conductors. The electrodes 16 protrude slightly from the ends of the chamber 20. The lamp 10 further comprises pools 18 of mercury positioned in the chamber 20 surrounding the electrodes 16.

An arc operates between the two electrodes 16. An external power supply provides a voltage to conductors 14 for initiation of the arc and for substained operation. The heat of the arc causes the pools 18 of mercury to vaporize thereby increasing the pressure in the chamber 20 to a very high value which may approach 100 atmospheres.

Devitrification, which usually begins near the mercury pools 18 at the ends of the envelope 12 and spreads toward the center of the envelope during lamp operation, has been substantially reduced by the use of high purity synthetic fused silica envelope material having an OH-content of less than five parts per million and a total metallic impurity content of about one part per million. Fifty lamps have been made using the above-identified material. In a laboratory environment, lamp life of 1000 hours without significant devitrification has been achieved and in a production environment, typical lamp life has ranged between 350 and 600 hours without significant devitrification. The shorter lamp life in the production environment can be explained by the increase in lamp impedance during operation and the inability of the production power supplies to operate the lamp at this higher impedance.

The following is a typical analysis of the envelope material disclosed above. The content of the elements chromium, gallium, gold, and uranium typically found in fused quartz has not been determined for synthetic fused silica.

| ELEMENT | PARTS PER MILLION (PPM) BY WEIGHT |
| --- | --- |
| Aluminum | .1 |
| Antimony | .002 |
| Arsenic | .03 |
| Boron | 0 to .01 |
| Cadmium | .0002 |
| Calcium | .1 |
| Copper | .004 |
| Iron | .2 |
| Lithium | 0 to .05 |
| Magnesium | 0 to .1 |
| Manganese | 0 to .01 |
| Phosphorus | .01 to .1 |
| Potassium | 0 to .001 |
| Silver | 0 to .05 |
| Sodium | .04 |
| Titanium | 0 to .1 |
| Zirconium | 0 to .001 |
| OH Radical | <5 |

A high purity synthetic fused silica which corresponds to the foregoing analysis is available commercially under the trademark SUPRASIL-W from Heraeus-Amersil, Inc.

The improved envelope material disclosed above may also be used in other high temperature applications where devitrification is a problem. Examples of other applications includes xenon and infrared lamps.

I claim:

1. In a high pressure mercury discharge device including an envelope, having lead-in conductors sealed in and extending through the ends thereof and terminating in electrodes, and having pools of mercury retained within said envelope around said electrodes, the improvement comprising, the composition of said envelope comprising synthetic fused silica having total metallic impurities of less than 1 part per million by weight and OH radical content of less than 5 parts per million by weight.

* * * * *